United States Patent [19]
Chinen

[11] Patent Number: 5,235,604
[45] Date of Patent: Aug. 10, 1993

[54] OPTICAL AMPLIFIER USING SEMICONDUCTOR LASER AS MULTIPLEXER

[75] Inventor: Koyu Chinen, Yokohama, Japan

[73] Assignee: Kabushiki Kaisha Toshiba, Kawasaki, Japan

[21] Appl. No.: 301,986

[22] Filed: Jun. 22, 1992

[30] Foreign Application Priority Data

Jul. 16, 1991 [JP] Japan .................. 3-175453

[51] Int. Cl.⁵ .............................. H01S 3/30
[52] U.S. Cl. ............................ 372/6; 372/101; 385/15; 385/39
[58] Field of Search ............ 372/6, 101, 96, 75, 372/64, 48; 385/33, 39, 15, 31, 34

[56] References Cited

U.S. PATENT DOCUMENTS

| | | | |
|---|---|---|---|
| 3,808,549 | 4/1974 | Maurer | 372/6 |
| 4,358,851 | 11/1982 | Safres et al. | 372/6 |
| 4,637,025 | 1/1987 | Snitzer | 372/6 |
| 4,674,830 | 6/1987 | Shaw et al. | 350/96.15 |
| 4,680,767 | 7/1987 | Hakini et al. | 372/6 |
| 4,835,779 | 5/1989 | Liou | 372/96 |
| 4,839,884 | 6/1989 | Schloss | 372/48 |
| 4,847,521 | 7/1989 | Huignard et al. | 307/425 |
| 4,871,230 | 10/1989 | Yamashita et al. | 350/96.34 |
| 4,963,832 | 10/1990 | Desurvire et al. | 359/4.3 |
| 5,007,698 | 4/1991 | Sasaki et al. | 372/6 |
| 5,023,885 | 6/1991 | Auracher et al. | 372/6 |
| 5,140,598 | 8/1992 | Tagawa et al. | 372/6 |

Primary Examiner—Léon Scott, Jr.
Attorney, Agent, or Firm—Finnegan, Henderson, Farabow, Garrett & Dunner

[57] ABSTRACT

An optical signal emitted from a first optical is applied to a semiconductor laser through a focusing lens so as to propagate through an active layer of the semiconductor laser. In the semiconductor laser, the optical signal is multiplexed with the laser emission power to produce a multiplexed optical signal. The multiplexed optical signal is then applied to a second optical fiber doped with a rare earth element such as erbium to carry out pumping of the rare earth element of the second optical fiber, thereby amplifying the optical signal.

7 Claims, 3 Drawing Sheets

OPTICAL AMPLIFIER USING SEMICONDUCTOR LASER AS MULTIPLEXER

BACKGROUND OF THE INVENTION

1. Field of the Invention

This invention relates to an optical amplifier for use in an optical transmission/reception system.

2. Description of the Related Art

An optical communication system transmits an optical signal by using a light emitting source such as a semiconductor laser, and performs long-distance transmission using an optical fiber or the like as a medium. In the system, the optical signal is often amplified to increase the transmission distance or the received signal level.

FIG. 2 shows an example of the conventional optical amplifier for amplifying the optical signal. An optical fiber 21 for transmitting the optical signal is connected to a WDM (Wavelength Division Multiplexing) fiber coupler 23 via a focusing lens 22. A semiconductor laser 26 is also connected to the WDM fiber coupler 23 via a focusing lens 27. The output terminal of the WDM fiber coupler 23 is connected to an EDF (Erbium Doped Fiber) 24 made of an optical fiber doped with a rare earth element, such as Erbium, of several hundreds ppm.

An optical input signal $P_{in}$ is propagated through the optical fiber 21 and applied to the WDM fiber coupler 23 via the focusing lens 22. A laser beam $P_m$ for pumping the rare earth element in the EDF 24 is emitted from the semiconductor laser 26 and applied to the WDM fiber coupler 23 via the focusing lens 27. The optical input signal $P_{in}$ and the laser beam Pm having a different wavelength are optically coupled by the WDM fiber coupler 23 and guided in only one direction. The multiplexed beam is applied to one end of the EDF 24. The laser beam $P_m$ in the multiplexed beam pumps the rare earth element in the EDF 24. Therefore, the stimulated emission occurs by the pumped rare earth element to amplify the optical input signal $P_{in}$, and the amplified optical signal is supplied from the other end of the EDF 24.

By the way, the WDM fiber coupler 23 has a complicated structure since the optical beams with the different wavelength must be multiplexed in the conventional optical amplifier so as to produce the output in only one direction. In addition, for applying the beam output from the WDM fiber coupler 23 to the EDF 24, it is necessary to connect one end of the WDM fiber coupler 23 to one end of the EDF 24 with great accuracy, i.e., the submicron order. Therefore, a highly complicated technique such as optical fiber splicing techniques must be used.

In summary, according to the conventional art, since the stimulated emission occurs by pumping the rare earth element of the optical fiber, the optical signal is amplified and transmitted. However, it is not possible to pump the rare earth element only by means of the optical signal. For this reason, a light source for pumping the rare earth element is required, and the semiconductor laser is used as the light source. Hence, for applying the optical signal and the pumping beam to the optical fiber doped with the rare earth element, the two beams must be multiplexed and guided in one direction. For this purpose, the WDM fiber coupler, which is expensive and has the complicated structure, must be used. Moreover, for coupling the WDM fiber coupler to the optical fiber, sophisticated techniques must be employed.

SUMMARY OF THE INVENTION

It is, accordingly, an object of the present invention to provide an improved optical amplifier.

Another object of the present invention is to provide an optical amplifier without using the WDM fiber coupler.

According to an aspect of the present invention, there is provided an optical amplifier which comprises a first optical fiber supplied with an optical signal, a semiconductor laser having an active layer, one facet of which is coupled to the first optical fiber, and a second optical fiber doped with a rare earth element and coupled to the other facet of the semiconductor laser. In this case, the optical signal is propagated through the active layer to carry out pumping of the rare earth element, thereby amplifying the optical signal in the second optical fiber.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

An embodiment of the present invention will now be described with reference to the accompanying drawings.

Figure 1:
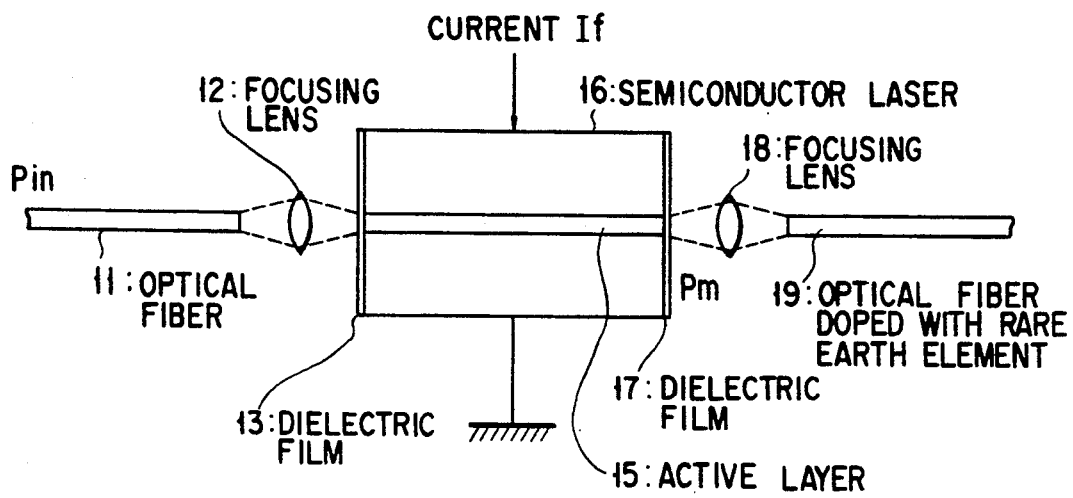
FIG. 1 is a diagram showing an optical amplifier according to an embodiment of the present invention.
Figure 2:
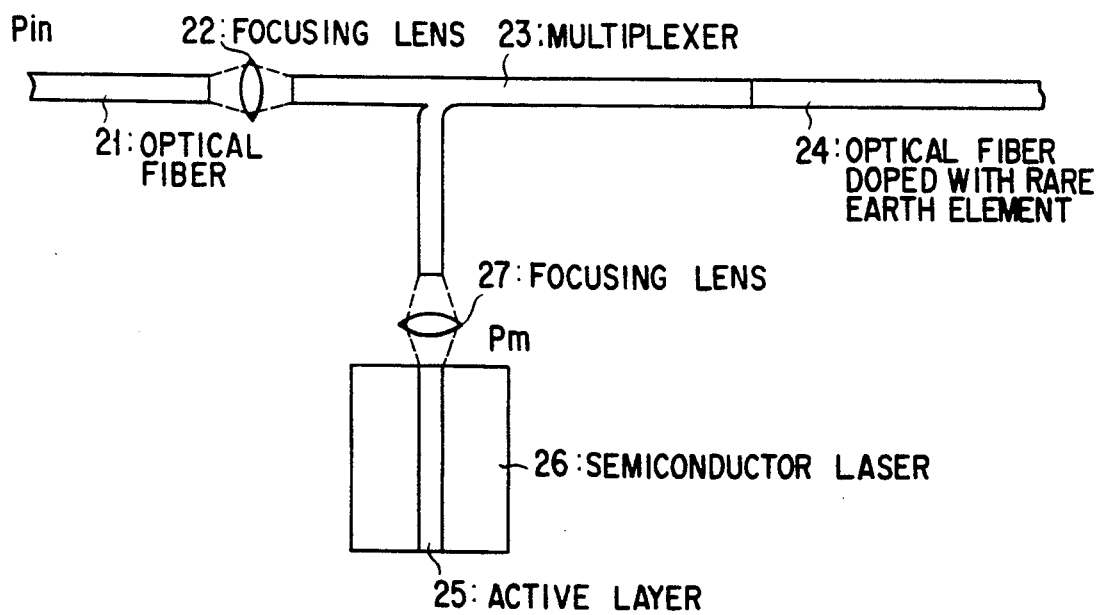
FIG. 2 is a diagram showing a conventional optical amplifier.
Figure 3:
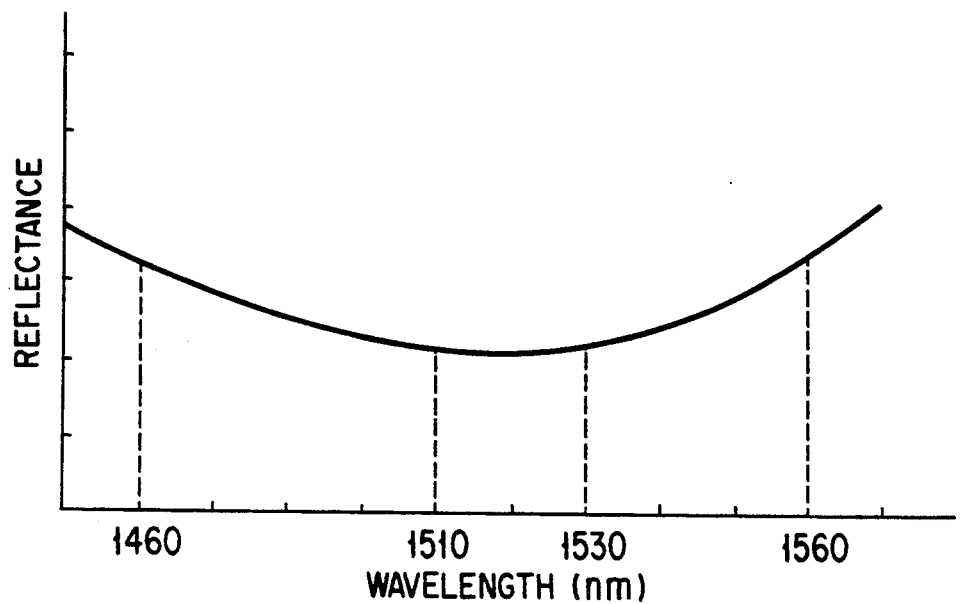
FIG. 3 is a diagram showing a reflectance-wavelength characteristic of a dielectric film used in a semiconductor laser of the present invention.
Figure 4:
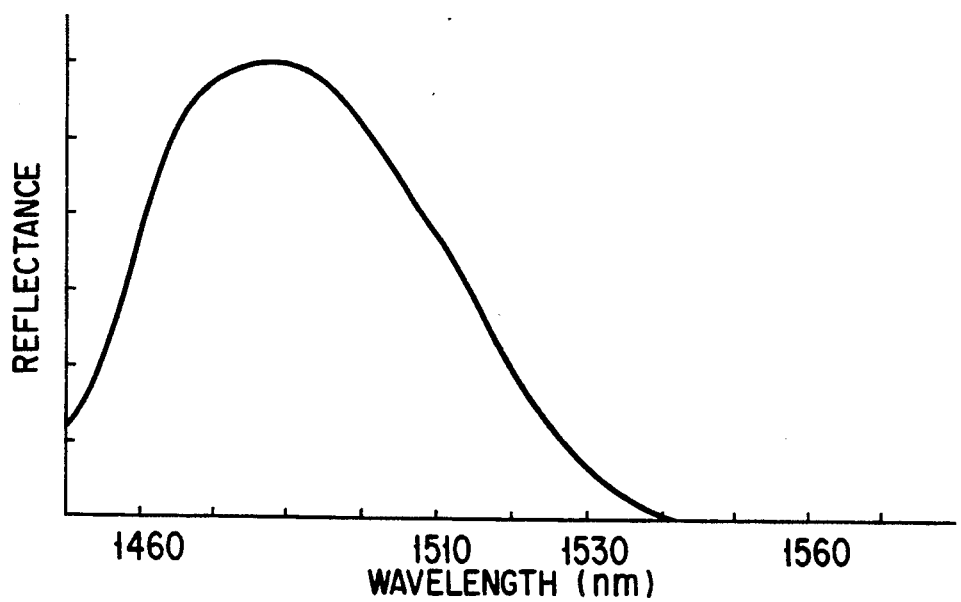
FIG. 4 is a diagram showing a reflectance-wavelength characteristic of another dielectric film used in the semiconductor laser of the present invention.
Figure 5:
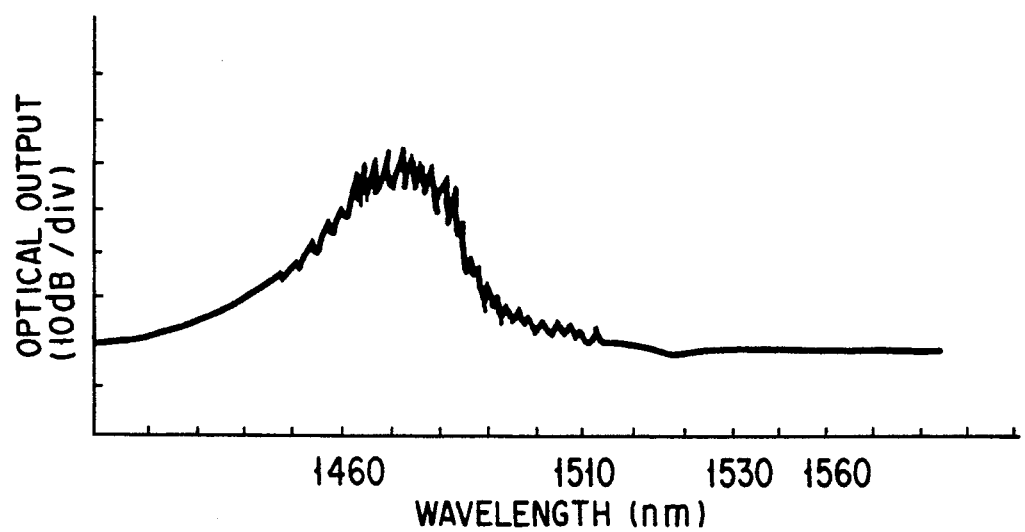
FIG. 5 shows a spectrum characteristic of the laser beam produced by the semiconductor laser of FIG. 1.

FIG. 1 is a diagram showing a structure of an embodiment of the present invention, FIGS. 3 and 4 ar diagrams showing the reflectance-wavelength characteristic of dielectric films coated on facets of a semiconductor laser, and FIG. 5 is a spectral diagram of the laser output emitted from the semiconductor laser.

As shown in FIG. 1, an optical fiber 11 is coupled to one facet, more specifically, an active layer 15, of a semiconductor laser 16 via a focusing lens 12. The other facet of the semiconductor laser 16 is coupled to an optical fiber 19 doped with a rare earth element via a focusing lens 18. Both facets of the semiconductor laser 16 coupled to the focusing lenses 12 and 18 are coated with dielectric films 13 and 17.

In the embodiment, an optical signal having a wavelength of 1.5 $\mu$m band will be described. As the optical fiber doped with rare earth element, for example, a silica type single mode optical fiber having a core diameter of 9 $\mu$m and a clad diameter of 125 $\mu$m is employed. The rare earth element is added to the core during fabrication so that the doping range is within a diameter of a several μm from the center of the core. Further, the rare earth element is selected in accordance with the wavelength of the optical signal to be amplified. Erbium is used in the case of 1.5 μm band. Erbium produces, in the silica fiber, energy levels of $^4I_{23/2}$, $^4I_{11/2}$, $^4I_{9/2}$, $^4F_{9/2}$ and $^4S_{3/2}$, which correspond to energy levels of 1.54 μm, 0.98 μm, 0.8 μm, 0.65 μm and 0.514 μm in the wavelength, respectively. For emitting an optical beam having the wavelength of 1.54 μm band by utilizing the energy level of $^4I_{23/2}$, electrons must be pumped to a level higher than the energy level. The level of $^4I_{23/2}$ includes metastable levels of 1.48 μm, 1.535 μm and 1.55 μm in the wavelength, and is pumped by an optical beam having a wavelength of 1.48 μm to emit optical beams having wavelengths of 1.535 μm and 1.55 μm.

A semiconductor laser is used as a pumping light source. In this case, it is effective to use the laser output having the wavelength of 0.98 μm or 1.48 μm. However, the semiconductor laser of 0.98 μm band requires a strained superlattice structure. Accordingly, it is possible sufficiently to pump the rare earth element of the optical fiber by subjecting the normal semiconductor laser of the 1.48 μm band to high output operation, although the pumping efficiency is slightly reduced. The high output semiconductor laser 16 is realized by a buried heterojunction having a InGaAsP/InP structure. The active layer 15 has a compound semiconductor composition of InGaAsP, and is capable of emitting a laser beam having a wavelength of 1.46 to 1.5 μm. FIG. 5 shows a spectrum of the laser output in the case where a current $I_f$ of 300 to 500 mA is injected into the semiconductor laser 16. Since each energy level in the EDF 19 has a certain range, the laser output having wavelength of 1.46 to 1.5 μm is sufficient to pump the level of 1.48 μm. Athough the laser output having a power as high as possible is required to increase the optical amplification factor, a satisfactory amplification factor is obtained by the laser output of 5 to 100 mW. Since the laser beam $P_m$ emitted from the facet of the semiconductor laser 16 has an elliptical output pattern having the half-width of approximately 30 and 40 degrees, it is necessary to use the focusing lens 18 in order to apply the laser beam to the EDF 19 having the core diameter of 9 μm.

The optical input signal $P_{in}$ is a low loss wavelength relative to the silica fiber and has the wavelength of 1.535 μm or 1.55 μm adapted to the energy level of the EDF 19. The optical input signal $P_{in}$ is applied to the facet of the active layer of the semiconductor laser 16 from the silica fiber 11, using the focusing lens 12. The active layer 15 has a cross section of 0.2×1.5 μm and a length of 400 to 1000 μm. The size of the cross section is determined in consideration of the laser output and the mode control of an optical signal propagating through the active layer 15. The optical input signal $P_{in}$ propagating through the active layer 15 is applied to one end of the EDF 19 through the focusing lens 18 from the other facet of the semiconductor laser 16, along with the pumping laser beam $P_m$ of the 1.48 μm band generated by the semiconductor laser.

At this time, the optical input signal $P_{in}$ has the wavelength of 1.535 μm or 1.55 μm. Therefore, the input optical signal $P_{in}$ is not almost absorbed in the active layer 15 and multiplexed with the laser beam.

Since the facet of the semiconductor laser 16 coupled to the EDF 19 emits the high-power pumping laser beam and the optical signal, it is coated with the multilayer dielectric film 17 having a low reflectance as shown in FIG. 3. The facet of the semiconductor laser 16 coupled to the silica fiber 11 is coated with the multilayer dielectric film 13 having the reflection characteristic shown in FIG. 4, i.e., a high reflectance with respect to the laser beam having the wavelength of 1.48 μm band produced by the semiconductor laser 16, and a low reflectance with respect to the optical input signal having the wavelength of 1.53 μm to 1.56 μm.

Although the above embodiment has been described with regard to the optical signal having the wavelength of 1.5 μm band, the present invention is not limited thereto, but can be applied to optical signals from infrared to ultraviolet regions. In the above embodiment, the optical fiber, air and lenses are used as light propagation media; however, the present invention can be achieved in the same manner as the embodiment by using any media, for example, a semiconductor substrate and a dielectric substrate. In addition, an MQW structure or an optical waveguide may be added to the active layer of the semiconductor laser.

As is apparent from the description, according to the optical amplifier of the present invention, the optical signal supplied from the optical fiber is applied to one facet of the semiconductor laser via the focusing lens. The input optical signal is multiplexed in the semiconductor laser with the pumping beam produced by the semiconductor laser. The multiplexed beam is applied via the focusing lens from the other facet of the semiconductor laser to the optical fiber doped with the rare earth element. The pumping beam generated by the semiconductor laser pumps the rare earth element, with the result that stimulated emission occurs and the optical signal is amplified.

In this manner, optical signals having different wavelengths can be easily multiplexed without using the multiplexer which requires the sophisticated splicing technique. Therefore, it is unnecessary to couple the multiplexer to the optical fiber doped with the rare earth element, unlike in the conventional device requiring the complicated technique such as splicing techniques.

It is further understood by those skilled in the art that the foregoing description is only of the preferred embodiment and that various changes and modifications may be made in the invention without departing from the spirit and scope of thereof.

What is claimed is:

1. An optical amplifier comprising:
   a first optical fiber supplied with an optical signal;
   a semiconductor laser having an active layer, a first facet of said semiconductor laser being coupled to said first optical fiber; and
   a second optical fiber doped with a rare earth element, said second optical fiber being coupled to a second facet of said semiconductor laser; wherein said optical signal is propagated through said active layer to carry out pumping of said rare earth element, thereby amplifying said optical signal in said second optical fiber.

2. The optical amplifier according to claim 1, wherein a first focusing lens is provided between said first optical fiber and said first facet of said semiconductor laser to apply a focused optical signal to said active layer.

3. The optical amplifier according to claim 2, wherein said active layer acts as an optical waveguide.

4. The optical amplifier according to claim 2, wherein said semiconductor laser serves to multiplex said optical signal with an optical output produced by said semiconductor laser.

5. The optical amplifier according to claim 1, wherein a second focusing lens is provided between said second facet of said semiconductor laser and said second optical fiber to apply a multiplexed optical signal to said second optical fiber.

6. The optical amplifier according to claim 1, wherein said first facet of said semiconductor laser is covered with a first dielectric film that has a high reflectance relative to a wavelength pumping said rare earth element and also has a low reflectance relative to a wavelength emitted from said first optical fiber, while said second facet thereof is covered with a second dielectric film that has a low reflectance relative to a wavelength pumping said rare earth element and also has a high reflectance relative to a wavelength emitted from said first optical fiber.

7. The optical amplifier according to claim 1, wherein said rare earth element is erbium.

* * * * *